US006738195B2

(12) United States Patent
Matsumoto et al.

(10) Patent No.: US 6,738,195 B2
(45) Date of Patent: May 18, 2004

(54) OPTICAL MAGNIFICATION ADJUSTMENT SYSTEM AND PROJECTION EXPOSURE DEVICE

(75) Inventors: Noriyoshi Matsumoto, Tokyo (JP); Nozomu Kowatari, Tokyo (JP); Youichi Hirabayashi, Tokyo (JP)

(73) Assignee: Adtec Engineering Co., Ltd., Tokyo (JP)

( * ) Notice: Subject to any disclaimer, the term of this patent is extended or adjusted under 35 U.S.C. 154(b) by 19 days.

(21) Appl. No.: 10/289,786

(22) Filed: Nov. 7, 2002

(65) Prior Publication Data

US 2003/0095342 A1 May 22, 2003

(30) Foreign Application Priority Data

Nov. 21, 2001 (JP) .......... 2001-655425
Nov. 22, 2001 (JP) .......... 2001-356784

(51) Int. Cl.$^7$ .......... G02B 15/02
(52) U.S. Cl. .......... 359/672; 359/673; 359/675
(58) Field of Search .......... 359/672, 673, 359/675, 380, 670

(56) References Cited

U.S. PATENT DOCUMENTS 5,739,964 A * 4/1998 Allen .......... 359/727
6,480,262 B1 * 11/2002 Tanaka et al. .......... 355/67

* cited by examiner

*Primary Examiner*—David N. Spector
(74) *Attorney, Agent, or Firm*—Nields & Lemack

(57) ABSTRACT

An optical magnification adjustment system being capable of minutely correcting magnification. A first lens 1 of plano-convex is installed on the side of an object surface 5, and a second lens 2 of concave-plano is installed on the side of a formed image surface 7. By controlling the center space d between the first lens and the second lens, the image is enlarged or reduced. The radii of curvature R2 and R3 of the convex surface of the first lens and the concave surface of the second lens are respectively set according to the following equations.

$$R2=(1-n1)/\phi 2$$

$$R3=(n2-1)/\phi 3$$

where, $\phi 2$ and $\phi 3$ represent optical power, and n1 and n2 represent refraction indexes, respectively.

4 Claims, 4 Drawing Sheets

OPTICAL MAGNIFICATION ADJUSTMENT SYSTEM AND PROJECTION EXPOSURE DEVICE

BACKGROUND OF THE INVENTION

1. Field of the Invention

The invention relates to an optical magnification adjustment system and a projection exposure device.

2. Related Art

The photolithography method has been applied widely in various fields, in which a prescribed pattern is photographically imprinted by an exposure device on the surface of a substrate coated with photosensitive materials such as the photo resist, thereafter the pattern is formed on the substrate by etching process. Printed circuit boards are fabricated also by the exposure device in recent years. With a demand for more and more high-speed, multi-functional, and miniaturized electronics devices, the printed circuit boards are also required to be more and more multi-layered, dense, and microscopic.

Especially for building a multi-layered printed circuit board, an ultra-high precision is required in aligning a pattern on each layer with another when exposing the patterns.

In the tendency of the further miniaturization and multi-layering of printed circuit boards as mentioned above, the expansion and contraction of the board itself due to the difference between the expansion coefficients of the copper foil and the epoxy resin composing the printed circuit board can no longer be ignored.

SUMMARY OF THE INVENTION

It is an object of the present invention to provide an optical magnification adjustment system and a projection exposure device, that are capable of adjusting the magnification for projecting an image according to the expansion or contraction of a printed circuit board.

The preferred embodiment of the optical magnification adjustment system of the present invention has two lenses—the first lens being plano-convex or plano-concave and having an optical power of $\phi 2$ as defined by the equation below, and the second lens being concave-plano or convex-plano and having an optical power of $\phi 3$ as defined by the equation below—installed in a telecentric position on the side of the object surface to be projected or on the side of the projected image in the optical exposure system, and is capable of minutely adjusting the total system magnification of said optical exposure system.

$$\phi 3 = -\Phi(S1+e1)/d0$$

$$\phi 2 = (\Phi - \Phi 3)/(1 - d0\Phi 3)$$

where, $\Phi$: Optical power of the optical magnification adjustment system,

S1: Distance from the first surface of the first lens to the surface of an object 5 (photo mask surface), d0: Center space between the two lenses, that satisfies the magnification $\beta=1$, and e1=t1/n1 (where, t1: the center thickness of the first lens, n1: refractive index of the first lens)

By the system configuration described above, the magnification $\beta$ may be adjusted by increasing or decreasing the center space between the two lenses centering around d0, and therefore the magnification of the optical exposure system may be minutely corrected for high-precision enlargement or reduction of the projected image.

Further, with parallel planes of the same thickness as the total center thicknesses of said two lenses being inserted, it is desired to have the optical aberrations of said optical exposure system corrected in advance in accordance with its purpose.

By making said two lenses cylindrical, it is also possible to correct the magnification only in one direction of the image, either longitudinally or laterally, by adjusting the center space d in the same way as above.

In order to make achromatic condition, it is desired to set the Abbe numbers $\upsilon 1$ and $\upsilon 2$ of said two lenses in that the following equation will be satisfied.

$$\upsilon 1/\upsilon 2 \approx \phi 2/\phi 3$$

DETAILED DESCRIPTION OF THE PREFERRED EMBODIMENTS

The invention will now be described in reference to the attached drawings.

Figure 1:
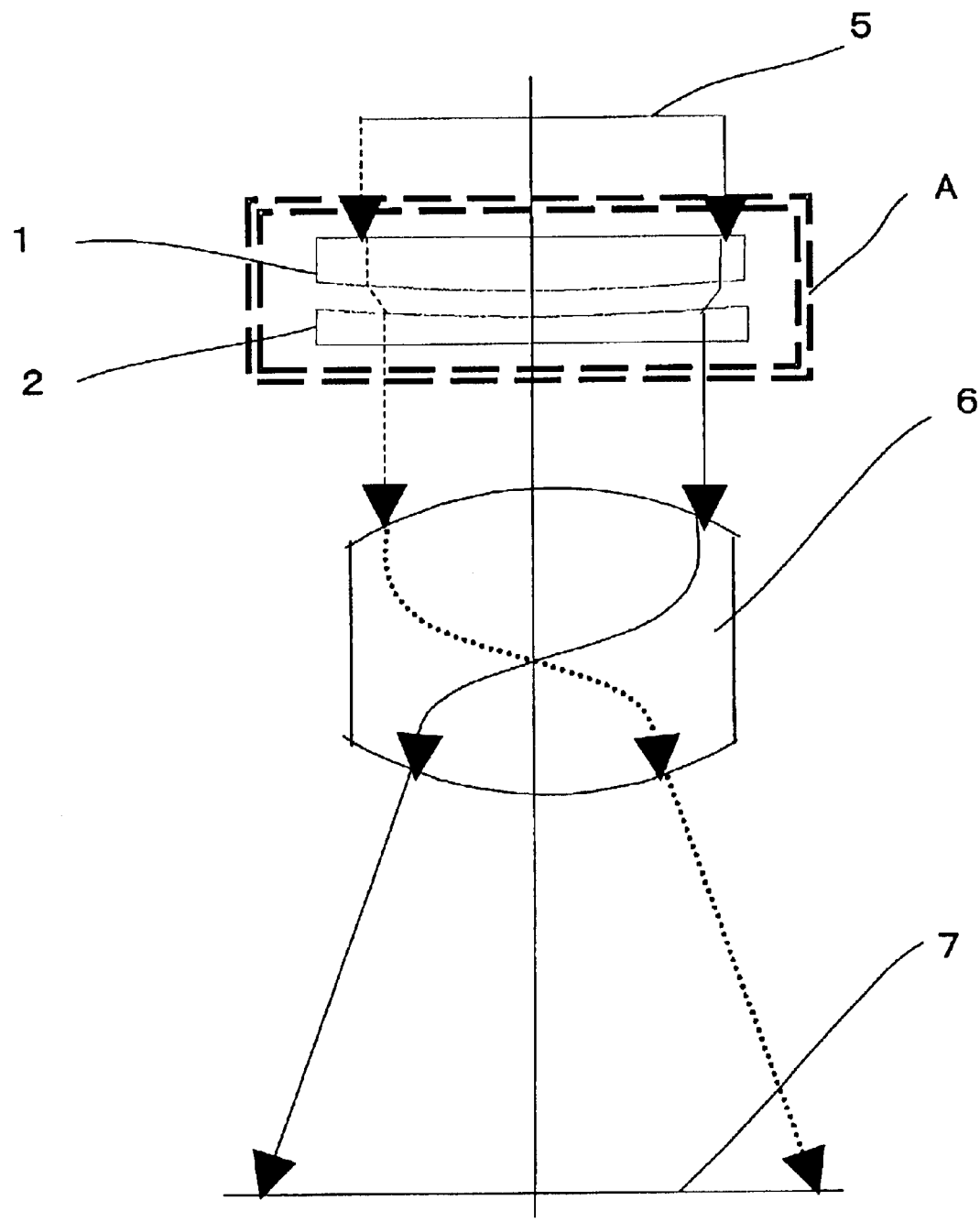
FIG. 1 is a schematic view of an embodiment of the optical magnification adjustment system of the invention.

FIG. 1 shows an optical magnification adjustment system A of the invention being installed in a projection exposure device for fabricating printed circuit boards.

Rays of an exposure frequency that transmit through an object surface 5 to be projected, which is the mask surface of a photo mask, are minutely magnified or reduced by the optical magnification adjustment system A in all directions or a predetermined direction according to a predetermined magnification, then are magnified or reduced by an optical exposure system 6 according to a regular projection magnification, and finally form an image on an image formation surface 7 of a printed circuit board. The projection exposure device will be described later in reference to FIG. 3.

The optical magnification adjustment system A comprises a first lens 1 and a second lens 2, and its magnification may be adjusted by adjusting the distance between the first lens 1 and the second lens 2. Also, by employing cylindrical lenses as the first lens 1 and the second lens 2, magnification or reduction in only one predetermined direction may be realized.

This magnification may be set to compensate for the expansion or contraction of the printed circuit board.

The optical magnification adjustment system A is supposed to be installed in a telecentric optical system. In this embodiment, it is installed in between the object surface 5 and the optical exposure system 6.

Figure 2:
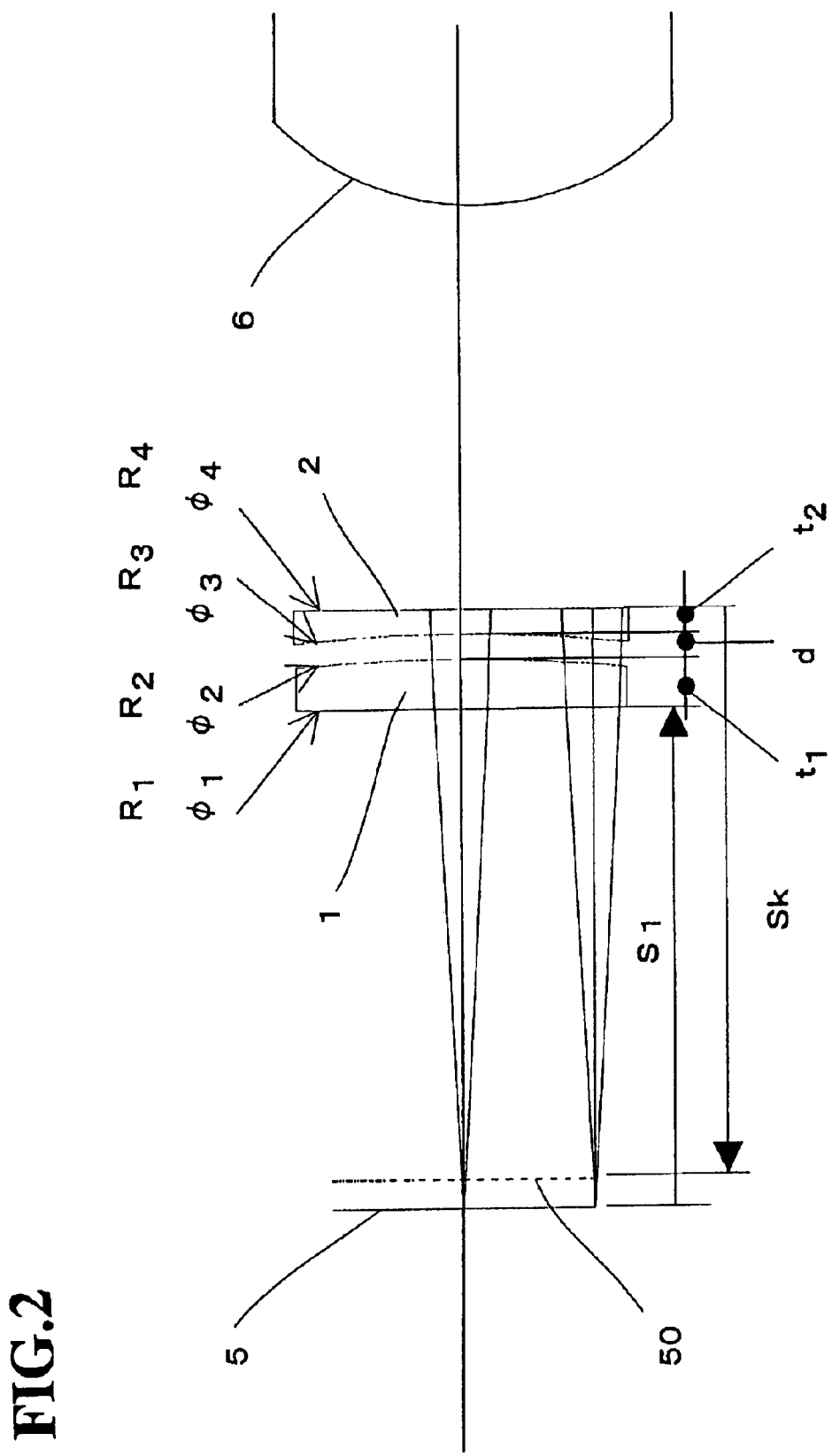
FIG. 2 is a diagram explaining the principle of operation of the embodiment of the optical magnification adjustment system of the invention.

FIG. 2 shows the architecture of the optical magnification adjustment system A in detail.

In this embodiment, the first lens 1 installed on the side of the object surface is plano-convex and the second lens 2 on the side of the image formation surface 7 is concave-plano. Also, the first lens may be plano-concave and the second lens 2 may be convex-plano.

By varying the center space d between the first lens 1 and the second lens 2, enlargement or reduction is made possible. Namely, by initially setting the magnification to equi-multiple when the center space d is d0, the magnification may be increased or decreased by varying the center space d around d0.

For this operation, the radii of curvature R2 and R3 of the convex surface of the first lens 1 and the concave surface of the second lens 2 are respectively set according to Equations 1 and 2 shown below. These equations are valid not only when the first lens 1 is plano-convex and the second lens is concave-plano, but also when the first lens 1 is plano-concave and the second lens 2 is convex-plano.

$$R2=(1-n1)/\phi 2 \qquad \text{Equation 1}$$

$$R3=(n2-1)/\phi 3 \qquad \text{Equation 2}$$

where, $\phi 2$ and $\phi 3$ represent the optical powers, respectively, and n1 and n2 represent the refractive indexes, respectively. Equations 1 and 2 above are derived as follows.

As shown in FIG. 2, let R1 and R2 respectively represent the radii of the surface curvatures of the first lens 1, R3 and R4 respectively the radii of the surface curvatures of the second lens 2, and $\phi 1$, $\phi 2$, $\phi 3$, and $\phi 4$ the optical powers (i.e., inverse of the focal distance) of respective surfaces.

Further, let t2 and n1 respectively represent the center thickness and the refractive index of the first lens 1, t2 and n2 respectively the center thickness and the refractive index of the second lens 2, and d the center space between the first lens 1 and the second lens 2. Let S1 represent the distance between the first surface R1 of the first lens 1 and the object surface 5 (i.e., photo mask surface), and Sk the distance between the second surface R4 of the second lens 2 and an image surface 50 (i.e., virtual image of the photo mask surface).

Letting $\Phi$ (i.e., inverse of the focal distance) represent the total power of the total optical magnification adjustment system, $\Phi$ may be obtained by Equation 3, since the optical powers $\phi 1$ and $\phi 4$ are zero because R1 and R4 are plane.

$$\Phi=\phi 2+\phi 3-d\phi 2\phi 3 \qquad \text{Equation 3}$$

In this instance, the magnification $\beta$ of the optical magnification adjustment system is represented by Equation 4 in accordance with the optical paraxial relationship.

$$\beta=-1/[\Phi(S1+e1)+d\phi 3-1] \qquad \text{Equation 4}$$

where, e1=t1/n1, and

S1>0 when the object surface is on the left side of the first lens.

Then, letting d be a standard space d0 when the magnification $\beta$ becomes equi-multiple (i.e., $\beta$=1), Equation 5 is derived from Equation 4 and $\phi 3$ may be obtained.

$$\phi 3=-\Phi(S1+e1)/d0 \qquad \text{Equation 5}$$

By substituting Equation 5 for Equation 3, $\phi 2$ may be obtained as follows.

$$\phi 2=(\Phi-\phi 3)/(1-d0\phi 3) \qquad \text{Equation 6}$$

As $\phi 2$ and $\phi 3$ are determined, the radii of curvature R2 and R3 may be respectively obtained from the refraction indexes of the two lenses, as shown in the following Equations 1 and 2.

$$R2=(1-n1)/\phi 2 \qquad \text{Equation 1}$$

$$R3=(n2-1)/\phi 3 \qquad \text{Equation 2}$$

The total power $\Phi$ of the optical magnification adjustment system may be set within the tolerance range of the telecentric degree of the optical exposure system. In other words, the focal distance of the optical magnification adjustment system may be assigned with a long focal distance that falls within the tolerance range of the telecentricity determined by the operation condition of the optical exposure system.

The system will become a plano-convex+concave-plano combination if a large negative (−) value is given to this focal distance, while it will become a plano-concave +convex-plano combination if a large positive (+) value is given.

By obtaining $\Phi$ from $\phi 2$ and $\phi 3$ obtained above, and by substituting $\Phi$ and $\phi 3$ for Equation 4, $\beta$ may be obtained by the following equation.

$$\beta=-1/[(\phi 2+\phi 3-d\phi 2\phi 3)(S1+e1)+d\phi 3-1] \qquad \text{Equation 4'}$$

where, e1=t1/n1.

As shown by this equation, the magnification $\beta$ varies with the change of the space d between the first lens 1 and the second lens 2, therefore the magnification $\beta$ may be corrected by changing the space d.

Moreover, the magnification $\beta$ of the total system including the optical exposure system may also be corrected by adjusting the space d.

In this instance, the limit of the adjustment of magnification of the optical magnification adjustment system is established when the space d between the first and second lenses equals 0, and the magnification ($\beta=\beta 0$) may be derived from Equation 4' above as follows.

$$\beta 0=-1/[(\phi 2+\phi 3)(S1+e1)-1] \qquad \text{Equation 4''}$$

In the above embodiment, the magnification varies at the same rate longitudinally and laterally with changing the space d between the two lenses because R2 and R3 of the first lens 1 and the second lens 2 are based on a spherical surface. This system configuration will be effective for multi-directionally correcting the magnification in order to compensate for temperature variation in the optical exposure system.

Other than the above embodiments, it is also possible to apply a cylindrical surface to the surfaces R2 and R3 of the first lens 1 and the second lens 2, respectively.

In this case, the surfaces R2 and R3 become parallel planes in the direction of the generator of the cylindrical surfaces, and the magnification in the direction of the generator becomes equi-multiple regardless of the space d between the first lens 1 and the second lens 2. That is, the magnification in the generator direction does not vary.

On the other hand, in the direction lateral to the generator of the cylindrical surface, the above theoretical equations are valid as they are. Therefore, the magnification may be changed only in the direction lateral to the generator of the cylindrical surface. Namely, by changing the space d of the first lens 1 and the second lens 2, reduction or enlargement correction centering around the standard space d0 (β=1) may be made possible.

Printed circuit boards, and other similar types of boards, may expand or contract only in one direction depending of the succeeding processes. Application of the cylindrical surfaces will be effective for compensating for such directional expansion or contraction.

After the rays are transmitted through the optical magnification adjustment system, the variation of the distance Sk between the image surface 50 of the object and the surface R4 may be expressed by Equation 7 based on the paraxial relationship.

$$Sk=[(1-d\phi3)S1+d]/[\Phi S1-(1-d\phi3)] \qquad \text{Equation 7}$$

From this equation, the shift range of the standard space d may be so determined that the difference to the distance Sk falls within the focal depth tolerance of the exposure system when letting the standard space d0 be the base.

Also, because the optical magnification adjustment system of the invention is in convex-concave relationship, namely, it is a Fraunhofer type system, the optical magnification adjustment system can be achromatic.

For example, if the refraction indexes of the wavelengths a and b to be achromatic are set to (n1a, n1b) and (n2a, n2b), by defining Abbe numbers υ1 and υ2 as shown in Equations 8 and 9, $$\upsilon 1=(n1-1)/(n1a-n1b) \qquad \text{Equation 8}$$

$$\upsilon 2=(n2-1)/(n2a-n2b) \qquad \text{Equation 9,}$$

the system may be achromatic by appropriately selecting υ1 and υ2 in Equation 10.

$$\upsilon 1/\upsilon 2 \approx \phi 2/\phi 3 \qquad \text{Equation 10}$$

As described above, minute magnification adjustment will be realized by adjusting the space between the lenses in the optical magnification adjustment system of the invention.

The projection exposure device shown in FIG. 1 will now be described in detail in reference to FIG. 3.

Figure 3:
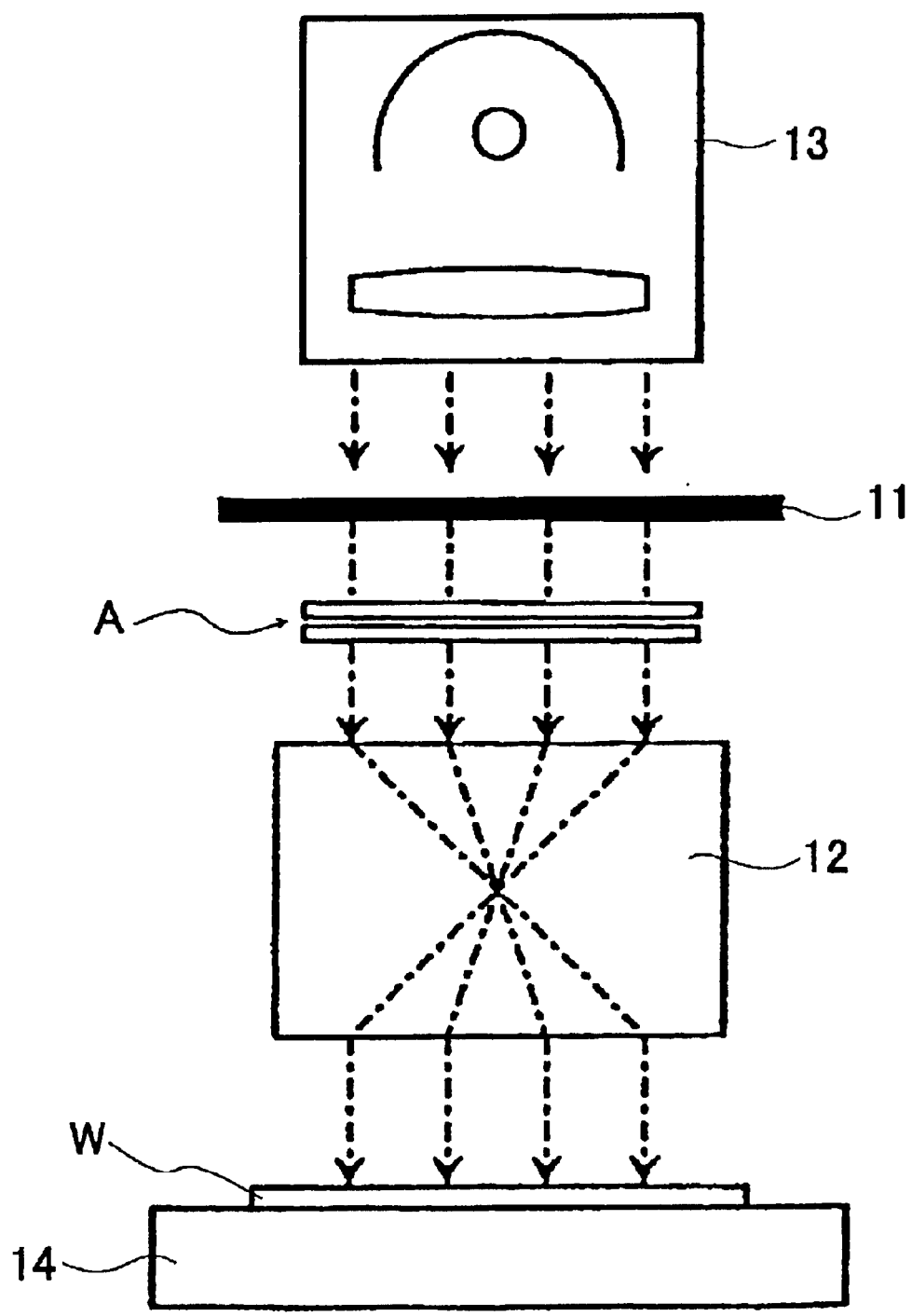
FIG. 3 is a schematic view of an embodiment of the projection exposure device of the invention.

FIG. 3 shows the process of receiving a printed circuit board W coated with photo resist from a preceding process, placing the board W on a stage 14 of the exposure device, imprinting a circuit patter, or the like, depicted on a photo mask 11, and then transferring the board W to the succeeding process.

The stage 14 is movable in the X, Y, Z directions and in θ degree angle for alignment purpose.

The photo mask 11 is installed facing the board W, and a light source device 13 is installed facing the other side of the photo mask 11 from the board W in that it irradiates rays of a predetermined frequency toward the photo mask 11.

A projection lens 12 is placed in between the photo mask 11 and the board W, in that a pattern on the photo mask 11 is projected onto the board W by enlargement or reduction according to a prescribed magnification.

In this embodiment, because the pattern on the photo mask 11 is projected by the projection lens 12, the photo mask 11 may be miniaturized. Also by moving the stage 14, multiple patterns may be projected on the board W.

Furthermore, although the photo mask 11 and the board W are arranged from top to bottom of the page, the arrangement is not limited to it. They may also be arranged in the reverse direction, or the photo mask 11 and the board W may be arranged vertically.

Also, the photo mask 11 may be moved instead of the board W, or both of them may be moved.

As said optical magnification adjustment system A is installed in between said photo mask 11 and said projection lens 12, enlargement or reduction of the pattern can be corrected.

In the above embodiments, the magnification may be varied by changing the center space d, but it is also possible to simplify the system configuration of the optical magnification adjustment system A by setting the magnification to a constant.

Figure 4:
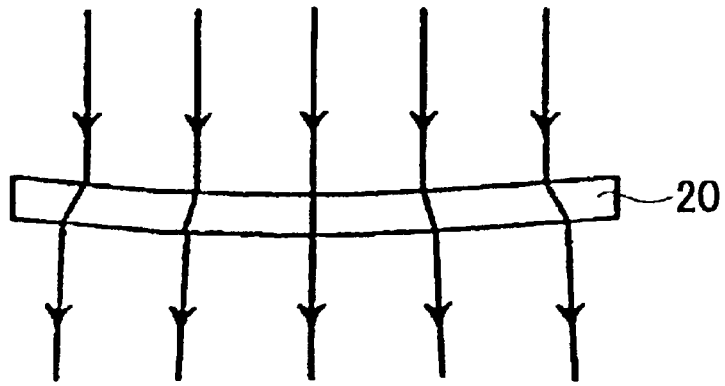
FIG. 4 is a diagram explaining the principle of operation of another embodiment of the optical magnification adjustment system of the invention.
Figure 5:
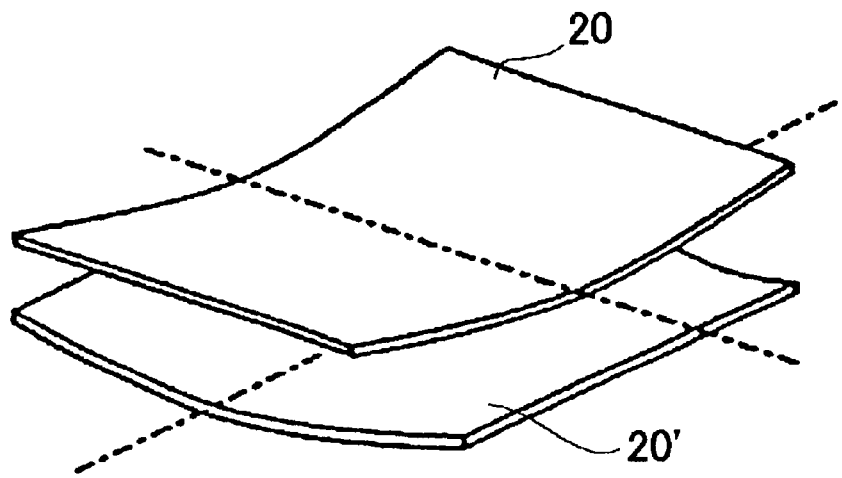
FIG. 5 is a diagram explaining the principle of operation of another embodiment of the optical magnification adjustment system of the invention.

An embodiment of such optical magnification adjustment system A is described by FIGS. 4 and 5. This embodiment of an optical magnification adjustment system employs a pair of parallel planes 20. As shown in FIGS. 4 and 5, the parallel planes 20 are bent according to a curve of secondary degree, thereby forming cylindrical surfaces, respectively. The parallel planes 20 are installed in between the photo mask 11 and the projection lens 12 in the path of the rays, and the generator of the parallel planes 20 is aligned with a desired direction of enlargement or reduction.

By this system configuration, the parallel rays transmitted from the light source device 13 through the photo mask 11 enter the parallel planes 20, and are magnified or reduced in only one direction before being transmitted out, as shown in FIG. 4, therein the projection magnification is changed.

Therefore, by aligning the generator of the parallel planes 20 to the longitudinal or lateral direction, enlargement or reduction in the longitudinal or lateral direction of the board W becomes possible.

As shown in FIG. 5, by arranging the two parallel planes 20 perpendicular to each other (i.e., their generators cross each other in 90-degree angle), enlargement or reduction in the 90-degree direction may be realized. By aligning the generators in the longitudinal and lateral directions of the board W in such system configuration, enlargement or reduction in both the longitudinal and lateral directions of the board W may be realized.

Figure 6:
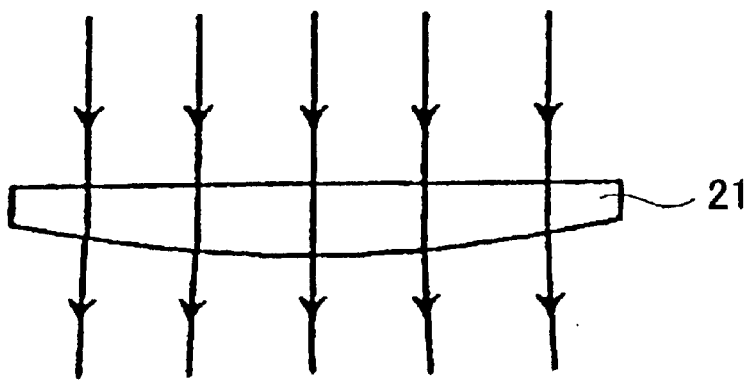
FIG. 6 is a diagram explaining the principle of operation of yet another embodiment of the optical magnification adjustment system of the invention.

In place of the parallel planes 20, cylindrical lenses 21 may be applied, as shown in FIG. 6. By employing a combination of the two cylindrical lenses 21 like in the case of the parallel planes 20, enlargement or reduction in both the longitudinal and lateral directions of the board W may be realized.

The adjusting magnifying power of the parallel planes 20 and the cylindrical lenses 21 may be determined according to the degree of expansion or contraction of the board W in the succeeding process. Namely, variation of the magnification may be realized by changing a cylindrical lens of different power.

As mentioned above, it is desired to install the optical magnification adjustment system A with the optical aberrations compensated in advance. Also, the optical magnification adjustment system A is supposed to be positioned at a, so to speak, telecentric position in the path of the rays.

As described above, said projection exposure device will allow said exposure to be rendered in accordance with the expansion or contraction of sail board W.

What is claimed is:
1. An optical magnification adjustment system comprising:
a first plano-convex or plano-concave lens with an optical power φ2, as defined by the equation below, and a second concave-plano or convex-plano lens with an optical power φ3, as defined by the equation below, both of which are installed in a telecentric position on the side of an object surface or on the side of an image in an optical exposure system, wherein the total system magnification of said optical exposure system may be minutely varied by changing the space between said lenses, $$\phi 3 = -\Phi(S1+e1)/d0$$

$$\phi 2 = -(\Phi-\phi 3)/(1-d0\phi 3)$$

where, $\Phi$: Total optical power of said optical magnification adjustment system, S1: Distance from the first surface of said first lens to said object surface (i.e., photo mask surface), d0; Center space of said two lenses, that satisfies a magnification $\beta=1$, e1=t1/n1 (t1: Center thickness of said first lens 1, n1: Refraction index of said first lens 1).

2. The system of claim 1 wherein:

said optical exposure system has its optical aberrations corrected in advance according to its purpose in a condition where parallel planes of their total thickness equal to the total central thicknesses of said two lenses are inserted.

3. The system of claim 1 wherein:

said two lenses are cylindrical lenses.

4. The system of claim 1 wherein:

each of Abbe numbers $\upsilon 1$ and $\upsilon 2$ of said two lenses is set to satisfy the following equation, $$\upsilon 1/\upsilon 2 \approx \phi 2/\phi 3.$$

* * * * *